(12) United States Patent
Griffin et al.

(10) Patent No.: US 9,159,458 B2
(45) Date of Patent: Oct. 13, 2015

(54) FLASH INTERFACE ERROR INJECTOR

(71) Applicant: International Business Machines Corporation, Armonk, NY (US)

(72) Inventors: Thomas J. Griffin, Salt Point, NY (US); Dustin J. Vanstee, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 14/090,059

(22) Filed: Nov. 26, 2013

(65) Prior Publication Data

US 2014/0143618 A1    May 22, 2014

Related U.S. Application Data

(63) Continuation of application No. 13/681,850, filed on Nov. 20, 2012, now Pat. No. 9,047,988.

(51) Int. Cl.
| | |
|---|---|
| *G11C 29/56* | (2006.01) |
| *G11C 29/44* | (2006.01) |
| *G06F 11/16* | (2006.01) |
| *G11C 16/34* | (2006.01) |
| *G11C 29/50* | (2006.01) |

(52) U.S. Cl.
CPC ............ *G11C 29/44* (2013.01); *G06F 11/1666* (2013.01); *G11C 16/349* (2013.01); *G11C 29/50016* (2013.01); *G11C 2029/5002* (2013.01)

(58) Field of Classification Search
CPC ........................................................ G11C 29/56
USPC ................... 714/703, 752, 758, 726, 767
See application file for complete search history.

(56) References Cited

U.S. PATENT DOCUMENTS

| | | | |
|---|---|---|---|
| 5,936,562 A * | 8/1999 | Brooks et al. ................. | 341/143 |
| 5,982,313 A * | 11/1999 | Brooks et al. ................. | 341/143 |
| 6,154,801 A | 11/2000 | Lowe et al. | |
| 6,167,479 A | 12/2000 | Hartnett et al. | |
| 7,073,106 B2 | 7/2006 | Paredes et al. | |
| 7,308,397 B2 | 12/2007 | Jibbe et al. | |
| 7,539,839 B1 | 5/2009 | Rhoten | |
| 8,010,934 B2 | 8/2011 | Kneisel et al. | |
| 8,296,739 B2 | 10/2012 | Kalla et al. | |
| 8,365,040 B2 | 1/2013 | Weingarten et al. | |
| 8,589,841 B2 | 11/2013 | Arbel et al. | |
| 2004/0267516 A1 | 12/2004 | Jibbe et al. | |
| 2005/0188281 A1 | 8/2005 | Nguyen et al. | |
| 2008/0133986 A1 | 6/2008 | Vainsencher et al. | |
| 2010/0253555 A1 | 10/2010 | Weingarten et al. | |

OTHER PUBLICATIONS

Hsueh et al. "Fault Injection Techniques and Tools", IEEE, Apr. 1997, pp. 75-82.

\* cited by examiner

*Primary Examiner* — Fritz Alphonse
(74) *Attorney, Agent, or Firm* — Cantor Colburn LLP; Margaret McNamara

(57) ABSTRACT

A flash interface error injector for end-of-life testing of a flash-based array includes a plurality of error injection logic blocks that are implemented by one or more processors. Each of the plurality of error injection logic blocks corresponds with a respective flash channel. The flash injector also includes a bit flip probability logic that identifies one or more bits to be flipped.

10 Claims, 3 Drawing Sheets

FLASH INTERFACE ERROR INJECTOR

CROSS-REFERENCE TO RELATED APPLICATION

This application is a continuation of U.S. application Ser. No. 13/681,850 filed Nov. 20, 2012, the disclosure of which is incorporated by reference herein in its entirety.

BACKGROUND

The present invention relates to flash memory technologies, and more specifically, to end of life testing.

Performance degradation over time is a critical issue with regard to flash-based solid state drive (SSD) technologies and, for that matter, all flash devices. These flash devices may be on peripheral component interconnect (PCI) cards, for example. Flash devices have memory organized as pages within blocks. While memory is programmed at a page boundary, an erase of memory occurs at the block boundary. This so-called program-erase cycle repeated over time causes degradation of the device. A controller, which may be implemented by an embedded processor, for example, must implement recovery functions such as error correction, bad block mapping, and wear leveling to mitigate issues created by the degradation over time. For example, the controller may retire bad blocks and replace them with reserve blocks.

Testing flash devices to simulate the control (e.g., replacement of bad blocks with reserve blocks) of device lifetime is an important aspect of ensuring accurate rating and reliability of systems that use SSD technologies or any flash devices. For example, an SSD vendor may specify that an SSD may be fully written ten times a day for up to five years. In order to set such an expectation, the vendor must perform lifetime testing of the device and ensure that the controller recovery mechanism is assured for the stated lifetime.

SUMMARY

According to one embodiment, a flash interface error injector for end-of-life testing of a flash-based device includes a bit flip probability logic, implemented by one or more bit flip probability processors, configured to identify one or more bits to be flipped; and a plurality of error injection logic blocks, implemented by one or more error injection processors, configured to inject errors in the one or more bits identified by the bit flip probability logic, each of the plurality of error injection logic blocks corresponding with a respective flash channel of the flash-based device.

According to another embodiment, a processor-implemented method of error injection at a flash interface of a flash-based device includes executing bit flip probability logic configured to identify one or more bits to be flipped; and executing a plurality of error injection logic blocks, each of the plurality of error injection logic blocks corresponding with a respective flash channel of the flash-based device, to inject errors at the one or more bits defined by the bit flip probability logic.

According to yet another embodiment, a non-transitory computer-readable medium stores therein a set of instructions which, when processed by a processor, cause the processor to execute a method of error injection at a flash interface. The method includes identifying one or more bits to be flipped; and injecting errors at the one or more bits defined by the identifying.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Lifetime testing of a flash device is essential to ensuring proper functionality of the recovery mechanism for the stated lifetime. Thus, a robust system and method of emulating the flash device lifetime by controllably injecting errors in the read path is needed in the flash memory industry.

Figure 1:
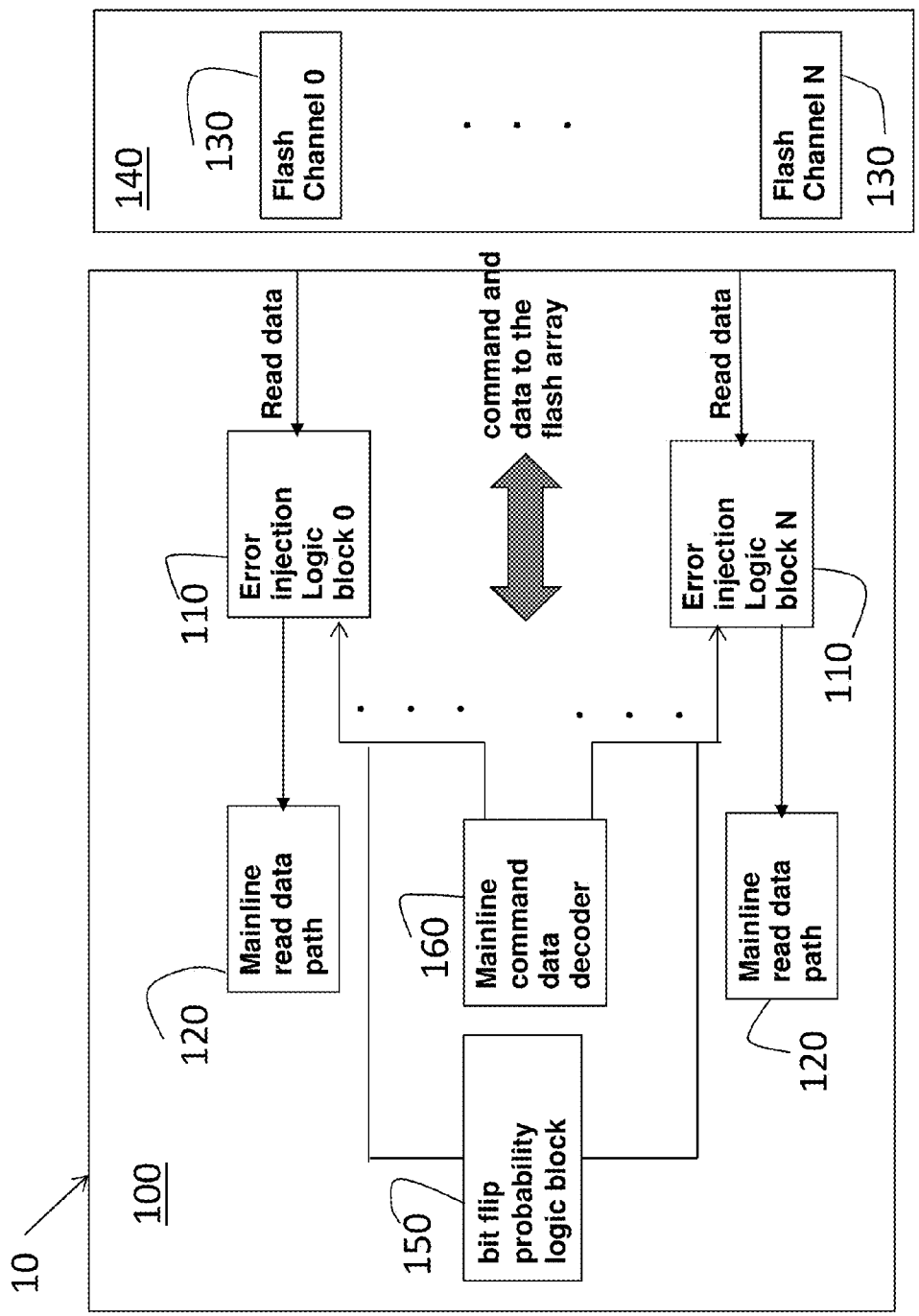
FIG. 1 is a block diagram of an error injector according to an embodiment.

FIG. 1 is a block diagram of an error injector 100 according to an embodiment. The error injector 100 operates at the flash array interface within a controller 10 and injects errors in the read path (prior to the error correction logic in the mainline read data path 120) to simulate bad blocks as detailed below. A bit flip (error) on a given read data bit is accomplished, according to an exemplary embodiment, by a digital logic gate implementing exclusive or (XOR) within each error injection logic block 110. An error injection logic block 110 is associated with each flash array channel 130 of a flash array 140. A flash array 140 can be comprised of one or multiple flash devices. Each flash array 140 channel 130 may be byte-wide, for example. By controlling the error injection through the error injection logic blocks 110, it is possible to simulate an acceleration of the wear experienced by a flash array 140. The error injection logic, which is determined by a bit flip probability logic block 150, may be accomplished as a hard injection on a specified bit (or bits) within a specified channel (or channels). In alternate embodiments, deterministic or random pattern injection may be performed by one or more of the error injection logic blocks 110 based on the bit flip probability logic block 150. In further alternate embodiments, as discussed with reference to FIG. 2 below, wear may be modeled in various other ways such as, for example, in a weighed pseudo-random pattern. The bit flip probability logic block 150 is shown as a separate input block to each error injection logic block 110 but may be a part of each error injection logic block 110 in alternate implementations of the error injector 100. The Mainline command data decoder 160 shown at FIG. 1 serves as the user interface for writing and reading data to and from the flash array 140.

Figure 2:
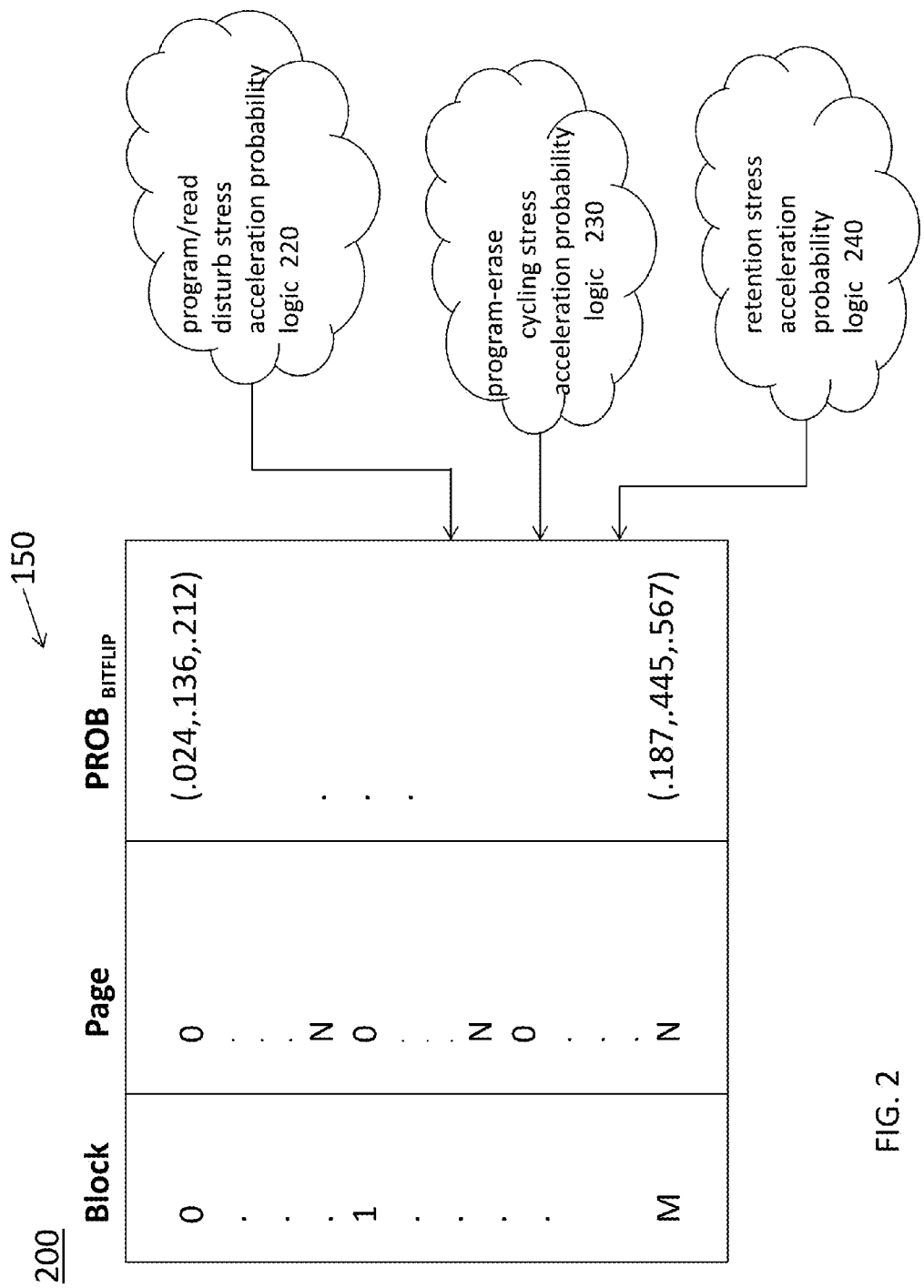
FIG. 2 illustrates a bit flip probability table used by the bit flip probability logic block of the error injector of FIG. 1 according to an embodiment.

FIG. 2 illustrates a bit flip probability table 200 used by the bit flip probability logic block 150 of the error injector 100 of FIG. 1 according to an embodiment. The mechanisms that represent the stresses that cause wear of the flash array 140 over time are used to build the bit flip probability table 200 and include program/read disturb stress acceleration probability logic 220, program-erase cycling stress acceleration probability logic 230, and retention stress acceleration probability logic 240. Each of the three wear mechanism stresses 220, 230, 240, which is detailed below, can be thought of as a factor that contributes to an error (bit flip) in the flash array 140. The program/read disturb stress acceleration probability logic 220 relates to programming or reading of other pages within the same block. The program-erase cycling stress acceleration probability logic 230 relates to application of a high voltage to erase a block for reprogramming that can cause errors in the block over repeated cycles. The retention stress acceleration probability logic 240 relates to the capacity of a flash device to simply retain its programmed values. This stress, too, is exacerbated with repeated program-erase cycles. In the embodiment shown in FIG. 2, each of the wear mechanism stresses 220, 230, 240 is used to determine the probability of bit flip ($PROB_{BITFLIP}$) at each page of each block of the flash array 140. In the current embodiment, $PROB_{BITFLIP}$ is an array of three probability values (e.g., 0.024, 0.136, 0.212) where each value ($STRESSx_{BITFLIP}$) is associated with one of the wear mechanism stresses 220, 230, 240, x, and represents the probability of bit flip due solely to that wear mechanism. In alternate embodiments, fewer or more wear mechanisms may be included which would decrease or increase the size of the $PROB_{BITFLIP}$ array, respectively. Also, in alternate embodiments, $PROB_{BITFLIP}$ accounting can occur at block or superblock (logical collection of blocks) granularities instead of page granularity in order to simplify the implementation of the design. The probability of bit flip due to a given wear mechanism 220, 230, 240 on a superblock/block/page is a function given by:

$$STRESSx_{BITFLIP}=f(\text{event count,acceleration factors, deceleration factors}) \quad [EQ\ 1]$$

where the event count tracks the number of times the given stress occurrence happens, acceleration factors are those factors that exacerbate the stress due to the given wear mechanism (220, 230, 240) x, and deceleration factors are those factors that reduce the stress due to the given wear mechanism (220, 230, 240) x. The equations that provide each $STRESS_{xBITFLIP}$ are detailed below with reference to equations 3, 4, and 5.

As noted above, the exemplary probability of bit flip values shown in the table 200 include a probability component for each of the wear mechanism stresses 220, 230, 240 ($STRESSx_{BITFLIP}$), which can be thought of as weighting factors for the overall $PROB_{BITFLIP}$. For example, the probability of a bit flip due to program/read disturb stress acceleration (220) is 0.024 at block 0, page 0 and is 0.187 at block M, page N. As also shown by the exemplary table 200, the probability of a bit flip due to retention stress acceleration (240) is 0.212 at block 0, page 0 and is 0.567 at block M, page N. The table 200 can be used by the bit flip probability logic block 150 to generate a weighted pseudo-random pattern of errors for the error injection logic blocks 110. The weighted pseudo-random pattern (WPRP) is a function given by:

$$WPRP=f(\text{page size},BITFLIP_{DENSITY},BITFLIP_{DIST}) \quad [EQ\ 2]$$

where the page size refers to the total number of bits that the probability will apply to, the density of the bit flip $BITFLIP_{DENSITY}$ is derived from the $PROB_{BITFLIP}$, and the distribution of the bit flip $BITFLIP_{DIST}$ is derived from $PROB_{BITFLIP}$ the and the bit flip diffusion coefficient $DIFF_{BITFLIP}$, which indicates whether the bit flips are uniform or clustered within pages and blocks of the flash array 140. For example, for a given density of bit flips $BITFLIP_{DENSITY}$, the error correction logic of the controller may be more stressed if the distribution of those bit flips ($BITFLIP_{DIST}$) is clustered rather than uniform. In addition, the distribution of the bit flips ($BITFLIP_{DIST}$) may apply over the entire flash array 140 or may have more granularity (e.g., have different distributions within pages or blocks).

Referring now to how the probability component for each of the wear mechanism stresses 220, 230, 240 is derived for each block and page, each type of wear mechanism stress will be discussed individually. The program/read disturb stress acceleration probability logic 220 relates to page-level stress and, specifically, to other pages (rather than the subject page) within the same block being programmed or read. The events and factors unique to program/read disturb stress acceleration probability logic 220 include disturb occurrence count (DstrbCnt) or the number of disturb occurrence events (an acceleration factor), block erase coefficient ($Ers_f$), which is a sliding acceleration factor that increases with each occurrence of a block erase associated with the subject page, and disturb acceleration coefficient ($DstrbAcc_f$). The probability of bit flip due to disturb stress is given by:

$$DISTURB_{BITFLIP}=DstrbOcc_f*\Sigma(Adj_f*DstrbCnt)*Ers_f*DstrbAcc_f \quad [EQ\ 3]$$

where $DstrbOcc_f$ is the occurrence coefficient, which is set by a user and represents an acceleration/deceleration factor applied to each disturb event. $Adj_f$ is the adjacency coefficient, which can be viewed as a weighting on each occurrence event that relates to the proximity/relevance of the other page that was programmed or read. Thus, a user testing the lifetime of a given flash array 140 may set the disturb acceleration coefficient $DstrbAcc_f$ such that program/read disturb stress acceleration is accelerated more than the other wear mechanism stresses 230, 240. A block erase resets the DstrbCnt of each page within the block to model the physical phenomenon of block erase returning flash cells to undisturbed states.

The program-erase cycling stress acceleration probability logic 230 relates to high voltage stress applied to flash cells during program and erase cycles. Because an entire block is erased before pages within that block are programmed, the program-erase cycling stress is a block-level stress. The events and factors unique to the program-erase cycling stress acceleration probability logic 230 include the program-erase occurrence count (PECnt) or the number of program-erase occurrence events (an acceleration factor), the program-erase occurrence coefficient ($PEOcc_f$), which is set by a user and represents an acceleration/deceleration factor applied to each program-erase event, dwell coefficient ($Dwl_f$), which relates to the dwell time or time between subsequent program-erase cycle operations and can be regarded as a deceleration factor because it decreases with increasing dwell time, erase acceleration coefficient ($PEAcc_f$), which is set by the user to control the relative acceleration of program-erase cycling stress acceleration over that of the other wear mechanism stresses 220, 240. The probability of bit flip due to program-erase cycling stress is given by:

$$PECYCLE_{BITFLIP}=PEOcc_f*PECnt*Dwl_f*PEAcc_f \quad [EQ\ 4]$$

The retention stress acceleration probability logic 240 relates to the capacity of the flash cell floating gate to maintain charge and retain its programmed state. The retention stress is a block-level stress since a block erase resets the state of the flash cell from a data retention standpoint. The events and factors unique to the retention stress acceleration probability logic 240 include dwell time (DwlTime), the block erase coefficient ($Ers_f$), and retention acceleration coefficient ($RetAcc_f$), which is set by the user to control the relative acceleration of retention stress acceleration over that of other wear mechanism stresses 220, 230. The probability of bit flip due to data retention stress is given by:

$$\text{RETENT}_{BITFLIP} = \text{DwlTime} * \text{Ers}_f * \text{RetAcc}_f \quad [\text{EQ 5}]$$

A block erase resets the retention score of each page within the block.

Figure 3:
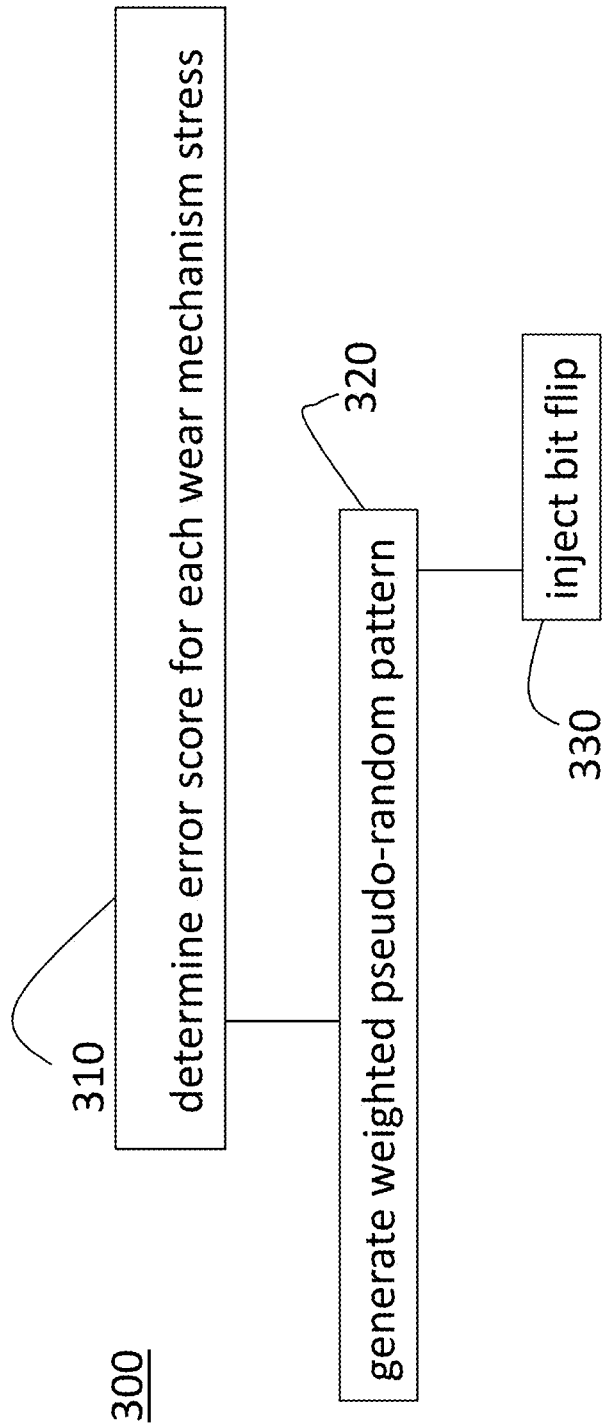
FIG. 3 illustrates the processes involved in performing error injection according to the various embodiments.

FIG. 3 illustrates the processes 300 involved in performing error injection according to the various embodiments discussed above. The processes 300 are performed by the controller 10 or, in alternate embodiments, other components with one or more processors and one or more storage devices. As shown at block 310, the processes 300 include determining error scores for each of the wear mechanism stresses 220, 230, 240 according to EQs. 3-5 discussed above, for example. The processes 300 also include generating a weighed pseudo-random pattern at block 320 according to EQ. 2, for example. At block 330, the weighted pseudo-random pattern may be used to inject errors as discussed with reference to FIG. 1. In alternate embodiments, injecting a bit flip at block 330 may be at one or more specified read data bits within one or more specified channels as a hard injection. In still other embodiments, a deterministic or random pattern of bit flips may be injected at block 330.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagram depicted herein is just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A processor-implemented method of error injection at a flash interface of a flash-based array, the method comprising:
   executing, using a processor, bit flip probability logic configured to identify one or more bits to be flipped; and
   executing, using the processor, a plurality of error injection logic blocks, each of the plurality of error injection logic blocks corresponding with a respective flash channel of the flash-based array, to inject errors at the one or more bits defined by the bit flip probability logic.

2. The method according to claim 1, wherein executing the bit flip probability logic includes identifying the one or more bits by page number and block number to affect a hard injection.

3. The method according to claim 1, wherein executing the bit flip probability logic includes generating the one or more bits to be flipped as a deterministic or random pattern.

4. The method according to claim 1, wherein executing the bit flip probability logic includes generating the one or more bits to be flipped as a weighted pseudo-random pattern.

5. The method according to claim 4, wherein the generating includes generating the weighted pseudo-random pattern with a particular density and a particular distribution of bit flips for a given number of bits.

6. The method according to claim 4, wherein the generating includes determining a probability of a bit flip based on accelerating factors.

7. A non-transitory computer-readable medium storing therein a set of instructions which, when processed by a processor, cause the processor to execute a method of error injection at a flash interface of a flash-based array, the method comprising:
   identifying one or more bits to be flipped; and
   injecting errors at the one or more bits defined by the identifying.

8. The method according to claim 7, wherein the identifying the one or more bits includes specifying an address by page number and block number of each of the one or more bits to affect a hard injection.

9. The method according to claim 7, wherein the identifying the one or more bits includes generating the one or more bits to be flipped as a deterministic or random pattern.

10. The method according to claim 7, wherein the identifying the one or more bits includes generating the one or more bits to be flipped as a weighted pseudo-random pattern.

* * * * *